(12) United States Patent
Lo et al.

(10) Patent No.: US 6,282,094 B1
(45) Date of Patent: Aug. 28, 2001

(54) BALL-GRID ARRAY INTEGRATED CIRCUIT PACKAGE WITH AN EMBEDDED TYPE OF HEAT-DISSIPATION STRUCTURE AND METHOD OF MANUFACTURING THE SAME

(75) Inventors: Randy H. Y. Lo, Taipei; Jeng Yuan Lai, Taichung; Eric Ko, Taichung Hsien; Tzong-Da Ho, Taichung, all of (TW)

(73) Assignee: Siliconware Precision Industries, Co., Ltd., Taipei (TW)

( * ) Notice: Subject to any disclaimer, the term of this patent is extended or adjusted under 35 U.S.C. 154(b) by 0 days.

(21) Appl. No.: 09/545,996

(22) Filed: Apr. 10, 2000

(30) Foreign Application Priority Data

Apr. 12, 1999 (TW) .......................................... 88105757 A

(51) Int. Cl.$^7$ ...................................................... H05K 7/20
(52) U.S. Cl. ........................... 361/704; 29/843; 257/720; 361/719
(58) Field of Search ................................. 165/80.3, 185; 174/252, 52.2, 52.4; 257/706, 707, 713, 720, 738, 780, 796; 361/704, 705, 707, 712, 717–719, 722; 29/830, 840, 843, 846; 438/106, 116, 125, 126

(56) References Cited

U.S. PATENT DOCUMENTS

| | | |
|---|---|---|
| 5,285,352 | 2/1994 | Pastore et al. . |
| 5,583,377 | 12/1996 | Higgins, III . |
| 5,642,261 | 6/1997 | Bond et al. . |
| 5,741,729 * | 4/1998 | Selna . |
| 5,825,628 * | 10/1998 | Garbelli . |
| 5,942,795 * | 8/1999 | Hoang . |
| 5,959,356 * | 9/1999 | Oh . |
| 6,008,536 * | 12/1999 | Mertol . |
| 6,023,098 * | 2/2000 | Higashiguchi . |
| 6,034,427 * | 3/2000 | Lan . |
| 6,038,137 * | 3/2000 | Bhatt . |
| 6,117,705 * | 9/2000 | Glenn . |
| 6,125,042 * | 9/2000 | Verdi . |

* cited by examiner

Primary Examiner—Gerald Tolin
(74) Attorney, Agent, or Firm—Peter F. Corless; Edwards & Angell, LLP

(57) ABSTRACT

A BGA (Ball-Grid Array) IC package with an unembedded type of heat-dissipation structure is proposed. The unembedded type of heat-dissipation structure is characterized in that a plurality of thermally-conductive vias are formed in the substrate and extending from the die-attachment area to the back side of the substrate; and further, a plurality of thermally-conductive balls are bonded to the thermally-conductive vias on the back side of the substrate. Moreover, a thermally-conductive layer is formed over a thermally-conductive area on the back side of the substrate on which the thermally-conductive balls are mounted for the purpose of increasing the exposed area of the overall heat-dissipation structure to the atmosphere. This allows the IC-produced heat during operation to be conducted through the thermally-conductive vias, the thermally-conductive balls, and the thermally-conductive layer to be dissipated the atmosphere. The unembedded manner of integration requires no openings to be formed in the substrate that would otherwise allow ambient moisture to enter into the inside of the package body as in the case of the prior art, and also allows the heat-dissipation structure to be more easily integrated to the package configuration. Due to these benefits, the BGA IC package can be manufactured through a more simplified and cost-effective process, while nevertheless providing a high heat-dissipation efficiency.

23 Claims, 3 Drawing Sheets

BALL-GRID ARRAY INTEGRATED CIRCUIT PACKAGE WITH AN EMBEDDED TYPE OF HEAT-DISSIPATION STRUCTURE AND METHOD OF MANUFACTURING THE SAME

BACKGROUND OF THE INVENTION

1. Field of the Invention

This invention relates to integrated circuit (IC) packages, and more particularly, to a BGA (Ball-Grid Array) IC package with an unembedded type of heat-dissipation structure.

2. Description of Related Art

The BGA IC packaging technology allows an IC package to be made very small in size while nevertheless providing highly integrated functionality from a single IC package. During the operation of the IC chip, however, a large amount of heat would be generated from the internal circuitry of the IC chip. Therefore, it is required to provide heat-dissipating means on the IC package for heat dissipation during operation. To allow a BGA IC package to dissipate the IC-produced heat during operation, a conventional solution is to arrange a heat sink or a heat slug in the package structure.

The U.S. Pat. No. 5,285,352 discloses a BGA IC package configuration that utilizes a heat sink for heat dissipation, whose structure is illustrated in FIG. 4. As shown, the BGA IC package configuration 110 includes an IC chip 112 mounted on a substrate 114 by means of silver paste 116, and is characterized in that a heat sink 128 is embedded in an opening 130 formed in the substrate 114 and beneath the IC chip 112. The heat sink 128 has a top side abutted on the bottom side of the IC chip 112 and a bottom side exposed to the atmosphere from the bottom side of the substrate 114. The IC-produced heat during operation can be dissipated through this heat sink 128 to the outside of the package body.

Moreover, the U.S. Pat. No. 5,642,261 discloses a BGA IC package configuration that utilizes a heat slug for heat dissipation, whose structure is illustrated in FIG. 5. As shown, the BGA IC package configuration includes an IC chip 70 mounted on a substrate 74, and is characterized in that a heat slug 72 is arranged beneath the IC chip 70. The heat slug 72 has a top side abutted on the bottom side of the IC chip 70 and a bottom side exposed to the atmosphere from the bottom side of the substrate 74. The IC-produced heat during operation can be dissipated through this heat slug 72 to the outside of the package body.

In addition, the U.S. Pat. No. 5,583,377 discloses a BGA IC package configuration that utilizes a heat sink for heat dissipation, whose structure is illustrated in FIG. 6. As shown, the BGA IC package configuration includes an IC chip 213 and a substrate 212, and is characterized in the use of a heat sink 222 having a base portion 224, a sidewall portion 226, and a flange portion 228. The heat sink 222 is embedded in an opening 220 formed in the substrate 212, and its flange portion 228 is fixed on the rim of the opening 220 on the top surface of the substrate 212. The IC chip 213 is mounted by means of silver paste 230 on the base portion 224 within the space defined by the sidewall portion 226. The IC-produced heat during operation can be dissipated through this heat sink 222 to the outside of the package body.

The foregoing patented package structures, however, have the following draw-backs.

First, since the heat slug or heat sink is embedded in the substrate and is different in coefficient of thermal expansion (CTE) from the substrate, the substrate would be easily subjected to compressive stress resulted from the heat slug or heat sink when undergoing a temperature change during the molding process, and thus easily deformed or broken.

Second, since the embedding of the heat slug or heat sink in the opening of the substrate would hardly achieve absolute airtightness, it would easily allow ambient moisture to enter into the inside of the package body. If the inside of the package body contains moisture, it would easily explode during the solder reflow process, resulting in the so-called popcorn effect, which can break up the entire package body.

Third, since it is required to form an opening in the substrate, it would make the overall manufacture process more complex, thus increasing the overall manufacture cost. In addition, the making of the heat slug and heat sink would require precise machining so as to allow the heat slug or heat sink to be fitted snuggly to the opening, which is also hard to achieve, thus resulting in poor quality of the manufactured IC package.

Fourth, since the heat slug or heat sink is typically made of metal, it would considerably increase the overall weight of the entire IC package, thus undesirably making the manufactured IC package heavier to handle.

SUMMARY OF THE INVENTION

It is therefore an objective of this invention to provide a BGA IC package configuration with an unembedded type of heat-dissipation structure, which can be manufactured using existing equipment and process.

It is another objective of this invention to provide a BGA IC package configuration with an unembedded type of heat-dissipation structure, which can prevent ambient moisture from entering into the inside of the package body.

It is still another objective of this invention to provide a BGA IC package configuration with an unembedded type of heat-dissipation structure, which can be manufactured easily through a simplified process so as to reduce manufacture cost.

In accordance with the foregoing and other objectives, the invention proposes a novel BGA IC package configuration that comes with an unembedded type of heat-dissipation structure.

The BGA IC package configuration of the invention includes: a substrate having a front surface and a back surface, with the front surface having a central part being defined as a die-attachment area; an IC chip mounted on the die-attachment area of the substrate; a first electrically-conductive trace formed over the front surface of the substrate, which is electrically connected to the IC chip; a plurality of electrically-conductive vias formed in the substrate and extending from the front surface to the back surface of the substrate; a plurality of electrically-conductive devices arranged on the back surface of the substrate and bonded to the electrically-conductive vias; a plurality of thermally-conductive vias formed in the die-attachment area of the substrate and extending from the front surface to the back surface of the substrate; a plurality of thermally-conductive devices arranged on the back surface of the substrate and bonded to the thermally-conductive vias; and a thermally-conductive layer spreading over the area where the thermally-conductive devices are arranged.

The thermally-conductive layer can help increase the exposed area of the overall heat-dissipation structure to the atmosphere, so that the overall heat-dissipation efficiency can be increased. Moreover, the unembedded manner of integration requires no openings to be formed in the substrate that would otherwise allow ambient moisture to enter into the inside of the package body as in the case of the prior art, and also allows the heat-dissipation structure to be more easily integrated to the package configuration, allowing the overall manufacture process to be more simplified and thus more cost-effective to carry out, making the invention more advantageous to use than the prior art.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

In accordance with the invention, two preferred embodiments are disclosed in full details in the following with reference to FIGS. 1, 2, and 3.

First Preferred Embodiment

Figure 1:
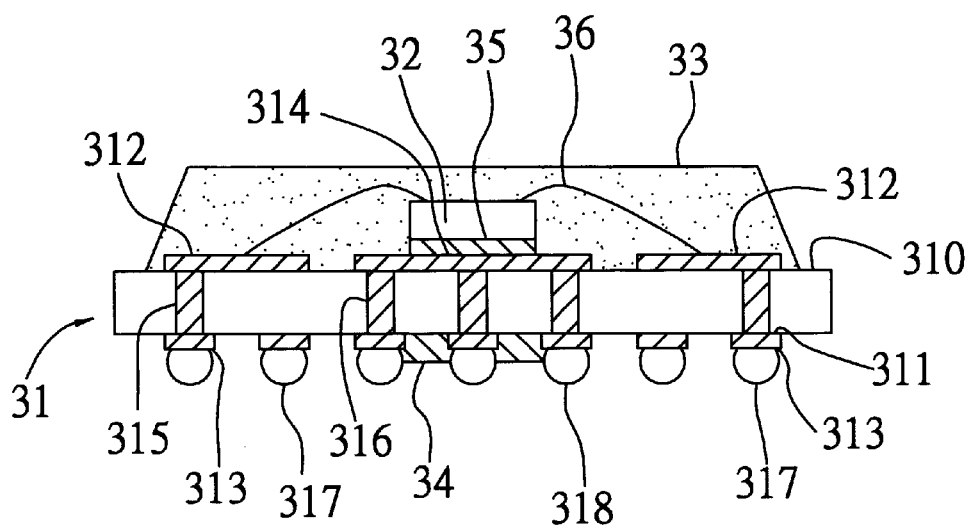
FIG. 1 is a schematic sectional diagram used to depict a first preferred embodiment of the invention.

FIG. 1 is a schematic sectional diagram used to depict the first preferred embodiment of the BGA IC package configuration with an unembedded type of heat-dissipation structure according to the invention. As shown, the BGA IC package configuration includes a substrate 31, an IC chip 32 mounted on the substrate 31, and an encapsulant 33 for encapsulating the IC chip 32.

The substrate 31 has a front surface 310 and a back surface 311. The central part of the front surface 310 is defined as a die-attachment area 314 for mounting the IC chip 32 thereon. Further, a plurality of first electrically-conductive traces 312 are formed on the front surface 310 of the substrate 31, while a plurality of second electrically-conductive traces 313 are formed on the back surface 311 of the same and electrically connected to the first electrically-conductive traces 312 through a plurality of electrically-conductive vias 315 formed through the substrate 31. On the back surface 311 of the substrate 31, a plurality of solder balls 317 are attached to the terminals of the second electrically-conductive traces 313. The IC chip 32 is electrically connected to the first electrically-conductive traces 312 via a set of bonding wires 36 so that the IC chip 32 can have electrical connections with external devices, such as a printed circuit board, by means of the solder balls 317. A Plurality of thermally-conductive vias 316 are also formed through the substrate 31 for thermally-conductive solder balls 318 attached to the back surface 311 of the substrate 31, so as to dissipate the heat generated by the IC chip 32 to the atmosphere. To enhance the heat-dissipation efficiency, a thermally-conductive layer 34 is formed on a thermally-conductive area on the back surface 311 of the substrate 31 on which the thermally-conductive solder balls 318 are mounted and which is opposite to the die-attachment area 314. The thermally-conductive layer 34 is formed in such a manner that the thermally-conductive solder balls 318 are each interconnected by the thermally-conductive layer 34 and protruded from the thermally-conductive layer 34 to a certain height. This allows the IC-produced heat during operation to be conducted successively through the thermally-conductive vias 316, the thermally-conductive layer 34, and the thermally-conductive solder balls 318 to the atmosphere. The electrically-conductive vias 315 and the thermally-conductive vias 316 can be, for example, both made from copper or formed by coating a copper layer on the inner surface of each of the vias 315 and 316. Alternatively, a mixture of metal and epoxy-based solder or an alloy of lead and tin (Pb/Sn) can be used for the formation of the thermally-conductive vias 316. The thermally-conductive layer 34 can be made, for example, from Pb/Sn alloy or silver paste.

The thermally-conductive layer 34 can help increase the overall exposed surface of this unembedded type of heat-dissipation structure in addition to the thermally-conductive solder balls 318, so that the overall heat-dissipation efficiency can be increased enhanced. In manufacture, it is to be noted that the thickness of the thermally-conductive layer 34 should be lower than the height of the thermally-conductive solder balls 318; otherwise, when the BGA IC package is mounted on a printed circuit board (PCB) through the surface-mount technology (SMT), it would make the thermally-conductive layer 34 come into contact with the electrically-conductive traces on the PCB, thus undesirably resulting in short-circuits or degradation to the heat-dissipation efficiency. Moreover, the thermally-conductive layer 34 should not be overly extended as to come into contact with the nearby electrically-conductive solder balls 317 and the second electrically-conductive traces 313, otherwise, short-circuits would be resulted. The thermally-conductive layer 34 also can help increase the grounding surface of the BGA IC package so that it can help reduce electrical noise during IC operation. The IC chip 32 is adhered to the die-attachment area 314 by means of silver paste 35 and is electrically connected to the first electrically-conductive traces 312 via the bonding wires 36. Since the use of these bonding wires 36 would result in a large projected footprint area on the substrate 31, it is preferable to use the conventional flip-chip method to mount the IC chip 32 on the substrate 31 so as to make the overall package structure more compact in size.

The encapsulant 33 is formed in such a manner as to encapsulate the entire IC chip 32, all of the bonding wires 36, and part of the front surface 310 of the substrate 31. This allows the IC chip 32 to be sealed out from the atmosphere and thus can help protect the IC chip 32 against ambient moisture and pollution. Compared to the prior art, since the thermally-conductive layer 34 is formed in an unembedded manner on the back surface 311 of the substrate 31, it is unnecessary to form an opening in the substrate 31 as in the case of the prior art, thus preventing ambient moisture from entering into the inside of the package body. The invention is therefore more advantageous to use than the prior art.

Figure 2:
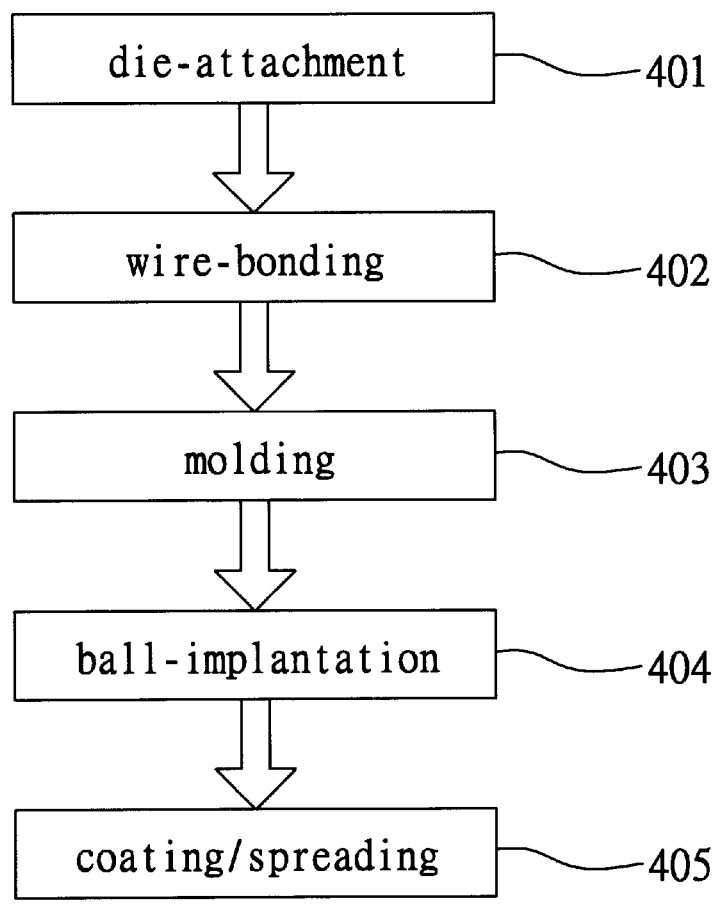
FIG. 2 is a flow diagram showing the procedural steps used to manufacture the BGA IC package of FIG. 1.

FIG. 2 is a flow diagram showing the procedural steps used to manufacture the BGA IC package configuration of FIG. 1.

As shown, the first step 401 is to perform a die-bonding process to mount an IC chip 32 on a substrate 31 which has a front surface 310 and a back surface 311, with the central part of the front surface 310 being defined as a die-attachment area 314, and which is formed with a plurality of first electrically-conductive traces 312 on the front surface 310 and a plurality of second electrically-conductive traced 313 on the back surface 311 and electrically connected to the first electrically-conductive traces 312 through a plurality of electrically-conductive vias 315 formed through the substrate 31, and which is further formed with a plurality of thermally-conductive vias 316 beneath in the die-attachment area 314 and extending from the front surface 310 to the back surface 311. The IC chip 32 is attached by means of silver paste 35 on the die-attachment area 314 in the front surface 310 of the substrate 31.

The next step 402 is to perform a wire-bonding process, in which a set of bonding wires 36 are used to electrically connect the IC chip 32 to the first electrically-conductive traces 312.

In the next step 403, a molding process is perform to form an encapsulant 33 to encapsulate the entire IC chip 32, all of the bonding wires 36, and part of the front surface 310 of the substrate 31.

In the next step 404, a ball-implantation process is performed to implant on the back surface 311 of the substrate 31 a plurality of electrically-conductive solder balls 317 to electrically connect the terminals of the second electrically-inductive traces 313 and a plurality of thermally-conductive solder balls 318 to thermally connect the thermally-conductive vias 316.

In the next step 405, a coating or spreading process is performed to form a thermally-conductive layer 34 over the thermally-conductive area in the back surface 311 of the substrate 31 where the thermally-conductive balls 318 are implanted. This can be achieved by applying melted tin, or other thermally-conductive material, over the thermally-conductive area to a thickness lower than the height of the thermally-conductive solder balls 318 and not coming in contact with the nearby electrically-conductive solder balls 317 and the second electrically-conductive traces 313. This completes the manufacture of the BGA IC package with an unembedded type of heat-dissipation structure according to the invention.

Second Preferred Embodiment

Figure 3:
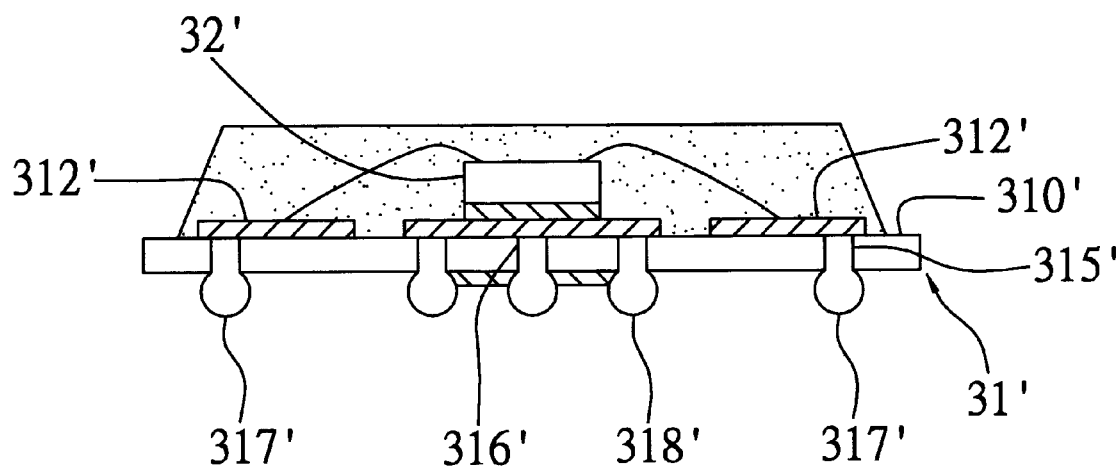
FIG. 3 is a schematic sectional diagram used to depict a second preferred embodiment of the invention.
Figure 4:
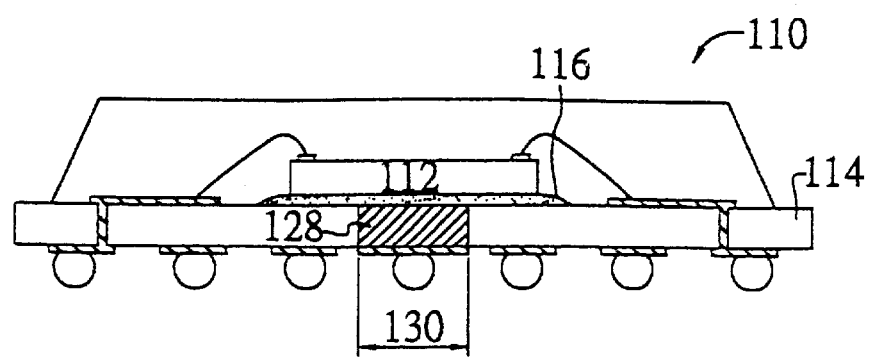
FIG. 4 (PRIOR ART) is a schematic sectional diagram used to depict the patented technology disclosed in U.S. Pat. No. 5,285,352.
Figure 5:
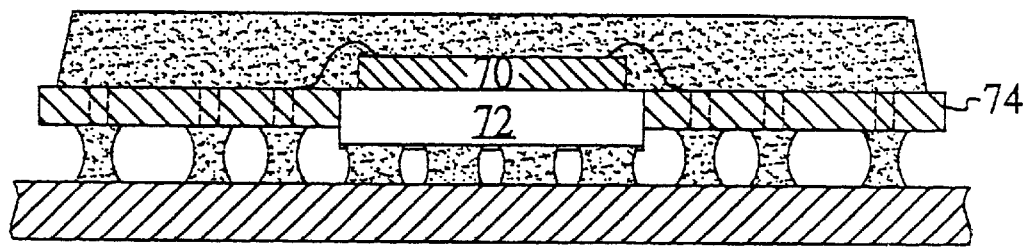
FIG. 5 ({PRIOR ART) is a schematic sectional diagram used to depict the patented technology disclosed in U.S. Pat. No. 5,642,261.
Figure 6:
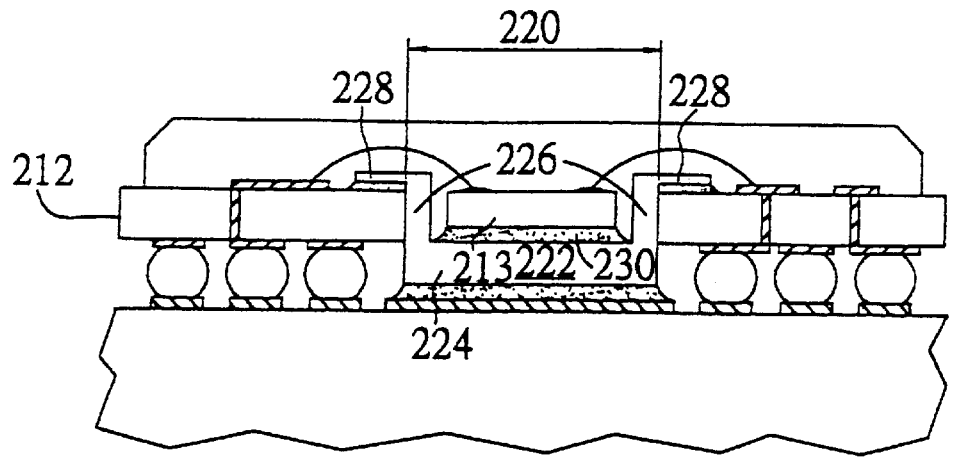
FIG. 6 (PRIOR ART) is a schematic sectional diagram used to depict the patented technology disclosed in U.S. Pat. No. 5,583,377.

FIG. 3 is a schematic sectional diagram used to depict a second preferred embodiment of the invention. In FIG. 3, all the reference numerals are appended with an apostrophe for distinguishing purpose.

This embodiment differs from the previous one in that a tape type of substrate 31' is used herein, and which is only provided with a plurality of electrically-conductive traces 312' over the front surface 310' of a tape substrate 31'. In addition, a plurality of the electrically-conductive solder balls 317' are implanted onto a plurality of first openings 315' formed through the tape substrate 31' for electrically connecting the electrically-conductive traces 312'. A plurality of thermally-conductive solder balls 318' are also implanted onto a plurality of second openings 316' formed through the tape substrate 31' so as to allow the heat generated by the IC chip 32' to be dissipated from the thermally-conductive solder balls 318' to the atmosphere.

Conclusion

In conclusion, the invention provides a BGA IC package with an unembedded type of heat-dissipation structure that can be integrated to the package in an unembedded manner so that it requires no openings to be formed in the substrate that would otherwise allow ambient moisture to enter into the inside of the package body as in the case of the prior art. Moreover, the unembedded manner also allows the heat-dissipation structure to be more easily integrated to the package, allowing the overall manufacture process to be more simplified and thus more cost-effective to carry out. The invention is therefore more advantageous to use than the prior art.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A BGA IC package with an unembedded type of heat-dissipation structure, which comprises:

a substrate having a front surface and a back surface, with the front surface having a central part being defined as a die-attachment area;

an IC chip mounted on the die-attachment area of the substrate;

a plurality of first electrically-conductive traces formed over the front surface of the substrate, which is electrically connected to the IC chip;

a plurality of electrically-conductive vias formed in the substrate and extending from the front surface to the back surface of the substrate;

a plurality of electrically-conductive means arranged on the back surface of the substrate and electrically connected to the electrically-conductive vias;

a plurality of thermally-conductive vias formed in the substrate and extending from the front surface to the back surface of the substrate;

a plurality of thermally-conductive means arranged on the back surface of the substrate and thermally connected to the thermally-conductive vias; and a thermally-conductive layer formed over a thermally-conductive area in the back surface of the substrate where the thermally-conductive means are arranged and said thermally-conductive layer being embedded between the thermally-conductive means.

2. The BGA IC package of claim 1, wherein the thermally-conductive layer is formed from a thermally-conductive metal.

3. The BGA IC package of claim 2, wherein the thermally-conductive metal is selected from the group consisting of tin and lead/tin alloy.

4. The BGA IC package of claim 2, wherein the thermally-conductive metal is silver paste.

5. The BGA IC package of claim 1, wherein the electrically-conductive means are each a solder ball.

6. The BGA IC package of claim 1, wherein the thermally-conductive means are each a solder ball.

7. The BGA IC package of claim 1, wherein the thermally-conductive layer has a thickness lower than the height of the thermally-conductive means.

8. The BGA IC package of claim 1, wherein the thermally-conductive layer is integrally formed with the thermally-conductive means.

9. The BGA IC package of claim 1, wherein the IC chip is electrically connected to the first electrically-conductive traces via a set of bonding wires.

10. The BGA IC package of claim 1, wherein the IC chip is electrically connected to the first electrically-conductive traces through the flip-chip technology.

11. The BGA IC package of claim 1, further comprising:
a plurality of second electrically-conductive traces formed over the back surface of the substrate and electrically connected through the electrically-conductive vias to the first electrically-conductive traces.

12. The BGA IC package of claim 11, wherein the second electrically-conductive traces are electrically connected to the electrically-conductive means on the back surface of the substrate.

13. The BGA IC package of claim 1 wherein the thermally-conductive means and the thermally-conductive layer together are exposed to the atmosphere.

14. A method for manufacturing a BGA IC package with an unembedded type of heat-dissipation structure, comprising the steps of:

(1) performing a die-bonding process to mount an IC chip on a substrate which has a front surface and a back surface, with the central part of the front surface being defined as a die-attachment area, and which is formed with a plurality of first electrically-conductive traces on the front surface and electrically connected to a plurality of electrically-conductive vias formed in the substrate and extending from the front surface to the back surface of the substrate, and which is further formed with a plurality of thermally-conductive vias in the substrate and extending from the front surface to the back surface of the substrate;

(2) performing a wire-bonding process to apply a set of bonding wires to electrically connect the IC chip to the first electrically-conductive traces;

(3) performing a molding process to form an encapsulant to encapsulate the entire IC chip, all of the bonding wires, and part of the front surface of the substrate, (4) performing an implantation process to implant on the back surface of the substrate; a plurality of electrically-conductive means to electrically connect the electrically-conductive vias and a plurality of thermally-conductive means to thermally connect the thermally-conductive vias; and (5) forming a thermally-conductive layer over a thermally-conductive area in the back surface of the substrate where the thermally-conductive means are implanted and said thermally-conductive layer being embedded between the thermally-conductive means.

15. The method of claim 14, wherein the thermally-conductive layer is formed from a thermally-conductive metal.

16. The method of claim 15, wherein the thermally-conductive metal is selected from the group consisting of tin and lead/tin alloy.

17. The method of claim 15, wherein the thermally-conductive metal is silver paste.

18. The method of claim 14, wherein the electrically-conductive means are each a solder ball.

19. The method of claim 14, wherein the thermally-conductive means are each a solder ball.

20. The method of claim 14, wherein the thermally-conductive layer has a thickness lower than the height of the thermally-conductive devices.

21. The method of claim 14, wherein the thermally-conductive layer is integrally formed with the thermally-conductive means.

22. The method of claim 14, further comprising the step of:
forming a plurality of second electrically-conductive traces over the back surface of the substrate and electrically connected through the electrically-conductive vias to the first electrically-conductive traces.

23. The method of claim 22, wherein the second electrically-conductive traces are electrically connected to the electrically-conductive means on the back surface of the substrate.

* * * * *